United States Patent
Shen

(10) Patent No.: US 11,476,552 B2
(45) Date of Patent: Oct. 18, 2022

(54) COAXIAL RF SWITCH WITH CONFINEMENT FLEXURES AND METHOD OF MAKING SAME

(71) Applicant: Jun Shen, Phoenix, AZ (US)

(72) Inventor: Jun Shen, Phoenix, AZ (US)

(73) Assignee: Magvention

( * ) Notice: Subject to any disclaimer, the term of this patent is extended or adjusted under 35 U.S.C. 154(b) by 550 days.

(21) Appl. No.: 16/565,266

(22) Filed: Sep. 9, 2019

(65) Prior Publication Data

US 2020/0203792 A1 Jun. 25, 2020

(51) Int. Cl.
  *H01P 1/12* (2006.01)
  *H01H 50/64* (2006.01)
  *H01H 51/32* (2006.01)
  *H01H 50/00* (2006.01)
  *H01H 50/18* (2006.01)
  *H01H 51/27* (2006.01)
  *H03K 17/51* (2006.01)
  *H01P 1/10* (2006.01)

(52) U.S. Cl.
  CPC .......... *H01P 1/125* (2013.01); *H01H 50/005* (2013.01); *H01H 50/18* (2013.01); *H01H 50/64* (2013.01); *H01H 51/27* (2013.01); *H01H 51/32* (2013.01); *H01P 1/10* (2013.01); *H03K 17/51* (2013.01)

(58) Field of Classification Search
  CPC ...... H01H 51/32; H01H 50/005; H01H 50/18; H01H 50/64; H01H 51/27; H01H 50/546; H01P 1/10; H01P 1/125; H01P 1/11; H03K 17/51
  See application file for complete search history.

(56) References Cited

U.S. PATENT DOCUMENTS

| | | | | |
|---|---|---|---|---|
| 3,414,849 A | * | 12/1968 | Burt, Jr. | ............... H01P 1/125 335/121 |
| 5,451,918 A | * | 9/1995 | Sun | ..................... H01P 1/125 335/4 |
| 9,508,513 B1 | * | 11/2016 | Shen | ..................... H01H 50/08 |
| 2010/0231333 A1 | * | 9/2010 | Shen | ................. H01H 51/2281 335/179 |

FOREIGN PATENT DOCUMENTS

DE 60120167 T2 * 5/2007 ......... G02B 26/0841

* cited by examiner

*Primary Examiner* — Mohamad A Musleh

(57) ABSTRACT

A coaxial RF switch comprising a pair of coaxial conductors and a confinement flexure affixing to a conductor reed, wherein said confinement flexure having at least one fixed end such that the conductor reed can move freely and consistently to make and break the connections to the coaxial conductors.

5 Claims, 3 Drawing Sheets

COAXIAL RF SWITCH WITH CONFINEMENT FLEXURES AND METHOD OF MAKING SAME

FIELD OF THE INVENTION

The present invention relates to confinement flexures used in switches and relays. More specifically, the present invention relates to confinement flexures used in coaxial RF switches and to methods of making the same.

BACKGROUND OF THE INVENTION

Coaxial RF switches are special types of electromechanical relays (or switches) wherein radio frequency (RF) signals are connected or disconnected between terminals in the switch. Typically a coaxial RF switch utilizes a pusher to push a conductor reed to make contact with a pair of coaxial conductor heads and connect the signal path between the two coaxial conductors. A common design uses a soft magnetic rocker under a pair of electromagnets to push the pusher for the switching action. In order to achieve repeatable and reliable contact between the conductor reed and the coaxial conductor heads, confinement rods are placed on the sides of a conductor reed to limit side-way motion of the reed. This confinement rods create additional friction between the rods and the reed, and as a result generate particles which can contaminate the contacts, which renders the switch unreliable.

It is highly desirable to provide a new confinement means which is easy to manufacture and highly reliable.

It is a purpose of the present invention to provide a new and improved confinement scheme which is simple to manufacture and highly reliable.

SUMMARY OF THE INVENTION

The above problems and others are at least partially solved and the above purposes and others are realized in a coaxial RF switch comprising a pair of coaxial conductors and a confinement flexure affixing to a conductor reed, wherein said confinement flexure having at least one fixed end such that the conductor reed can move freely and consistently to make and break the connections to the coaxial conductors.

BRIEF DESCRIPTION OF THE FIGURES

The above and other features and advantages of the present invention are hereinafter described in the following detailed description of illustrative embodiments to be read in conjunction with the accompanying figures, wherein like reference numerals are used to identify the same or similar parts in the similar views, and.

DETAILED DESCRIPTION OF EXEMPLARY EMBODIMENTS

It should be appreciated that the particular implementations shown and described herein are examples of the invention and are not intended to otherwise limit the scope of the present invention in any way. Indeed, for the sake of brevity, conventional electronics, manufacturing, and other functional aspects of the systems (and components of the individual operating components of the systems) may not be described in detail herein. Furthermore, for purposes of brevity, the invention is frequently described herein as pertaining to an electromagnetic relay or switches for use in electrical or electronic systems. It should be appreciated that many other manufacturing techniques could be used to create the relays described herein, and that the techniques described herein could be used in mechanical relays, optical switches, fluidic control systems, or any other switching devices. Further, the techniques would be suitable for application in electrical systems, optical systems, consumer electronics, industrial electronics, wireless systems, space applications, fluidic control systems, medical systems, or any other application. Moreover, it should be understood that the spatial descriptions made herein are for purposes of illustration only, and that practical failsafe switches may be spatially arranged in any orientation or manner. Multi-pole-multi-throw types of these switches can also be formed by arranging them in appropriate ways and with appropriate devices.

Figure 1:
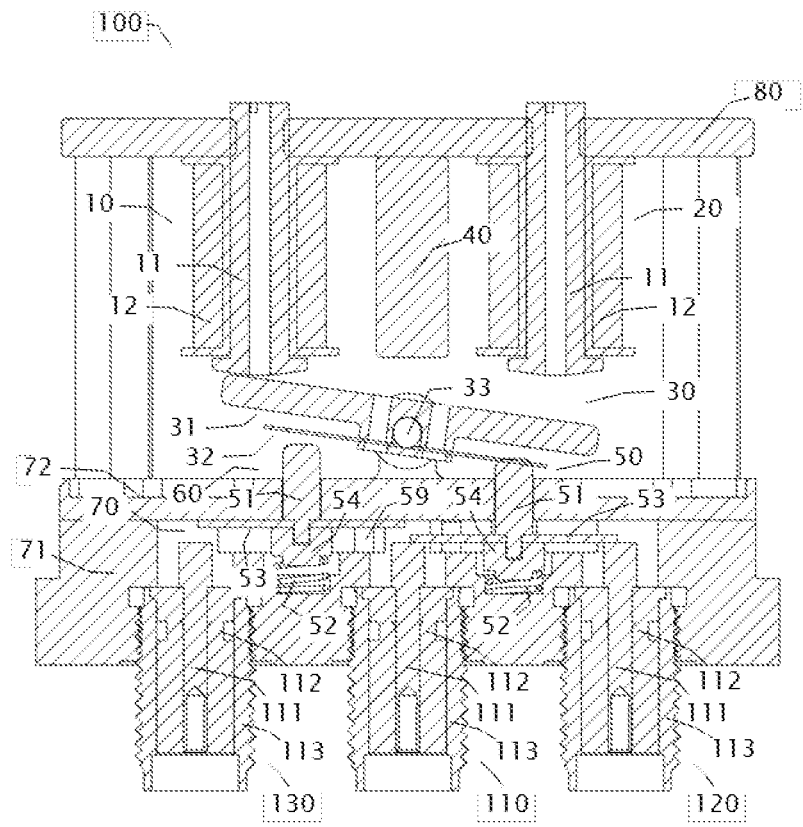
FIG. 1 is a cross-sectional view of a prior art coaxial RF switch with confinement rods.
Figure 2:
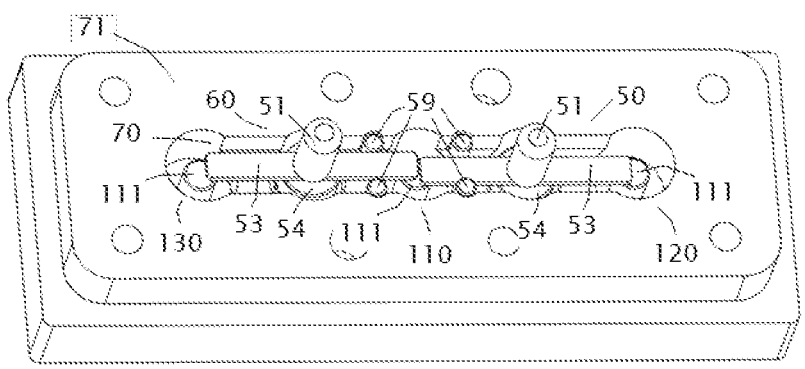
FIG. 2 is an exploded detailed view of the prior art coaxial RF switch with confinement rods.

FIGS. 1 and 2 show a cross-sectional and a detailed views of a prior art coaxial RF switch with confinement rods. With reference to FIGS. 1 and 2, a prior art coaxial RF switch 100 suitably comprises a pair of solenoids 10 and 20, rocker assembly 30, permanent magnet 40, soft magnetic plate 80, pusher assemblies 50 and 60, cavity 70, coaxial connectors 110, 120, and 130, and confinement rods 59.

Solenoids 10 and 20 are formed by having coils 12 wound around a bobbin and a soft magnetic core 11. Rocker assembly 30 comprises soft magnetic rocker 31, rocker cantilever 32 and pivot 33. Pusher assemblies 50 and 60 comprises top pusher 51 and bottom pusher 54, restoring spring 52 and conductor reed 53. Top pusher 51 has a narrow end going through a hole in the conductor reed 53 and fit into a hole in the bottom pusher. Cavity 70 is an enclosure formed by lower body 71 and cover 72. Body 71 and cover 72 are made of metallic material (such as Copper, Aluminum, etc.), and are in electrical contact to form a electrical ground. Each of coaxial conductors 110, 120 and 130 comprises center conductor 111, dielectric ring 112 and shell 113.

As shown in FIGS. 1 and 2, when rocker 31 is attracted by left-hand core 11 of solenoid 10 and turns clockwise, the right end of rocker cantilever 32 pushes pusher assembly 50 downward and causes conductor reed 53 to connect the center conductors 111 of both coaxial conductors 110 and 120, enabling RF signals to pass from coaxial conductor 110 to coaxial conductor 120 (or vice versa). At the same time, left hand pusher assembly 60 is pushed upward by restoring spring 52 and lifts left hand conductor reed 53, disconnecting the RF signal path between coaxial conductors 110 and 130. Confinement rods 59 are placed on the sides of conductor reed 53 to limit the side-way (in or out of paper) movements of the conductor reed 53 while allowing its vertical movement. In this configuration, pusher 53 goes through a tight hole in cover 72, which further limits the lateral (left or right) and side-way movements of the conductor reed 53.

As aforementioned, a drawback in such a design is that additional friction between conductor reed 53 and confinement rods is unavoidable. Also, the additional mating features (the narrow end in top pusher 51 and the holes in bottom pusher 54 and conductor reed 53) adds complexity in design and manufacturing of the coaxial switch 100.

This invention discloses a coaxial RF switch with new confinement means which greatly improves the reliability and reduces manufacturing complexity, as detailed as follows.

Figure 3:
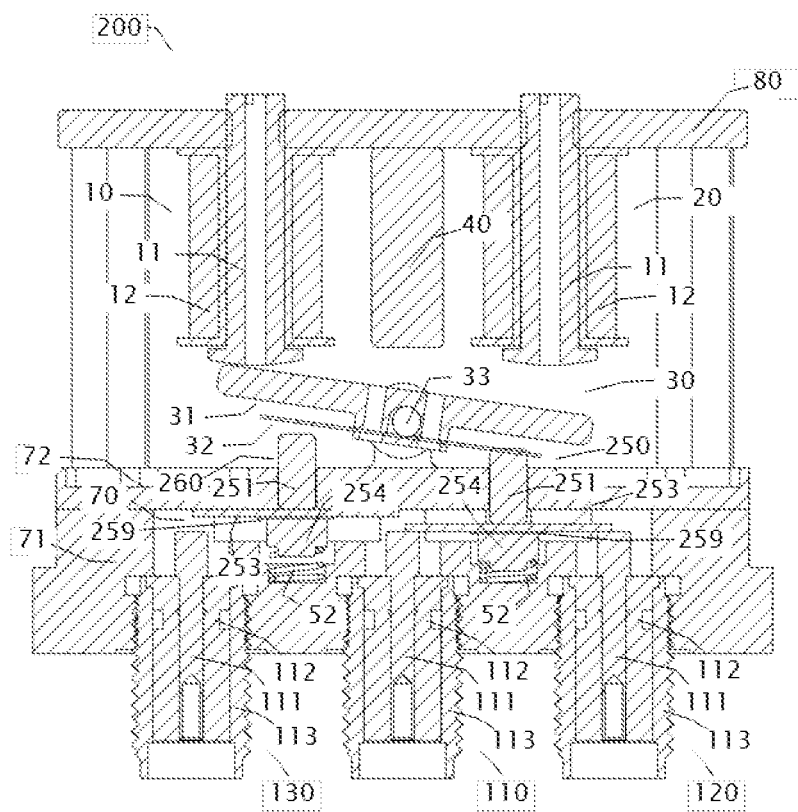
FIG. 3 is a cross-sectional view of an exemplary embodiment of a coaxial RF switch with a new confinement flexure of the present invention.
Figure 4:
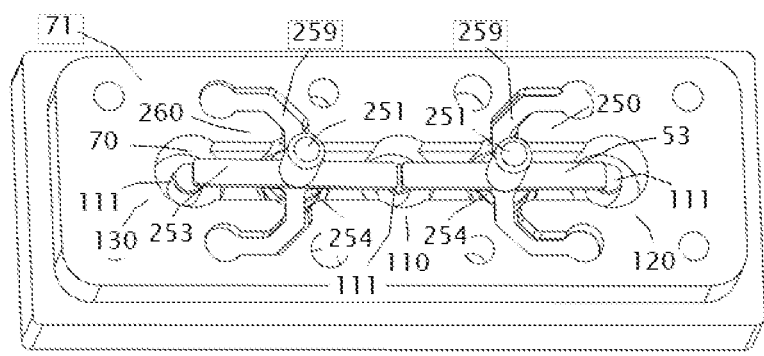
FIG. 4 is an exploded and detailed view of the exemplary embodiment of a coaxial RF switch with a new confinement flexure with reference to FIG. 3.
Figure 5:
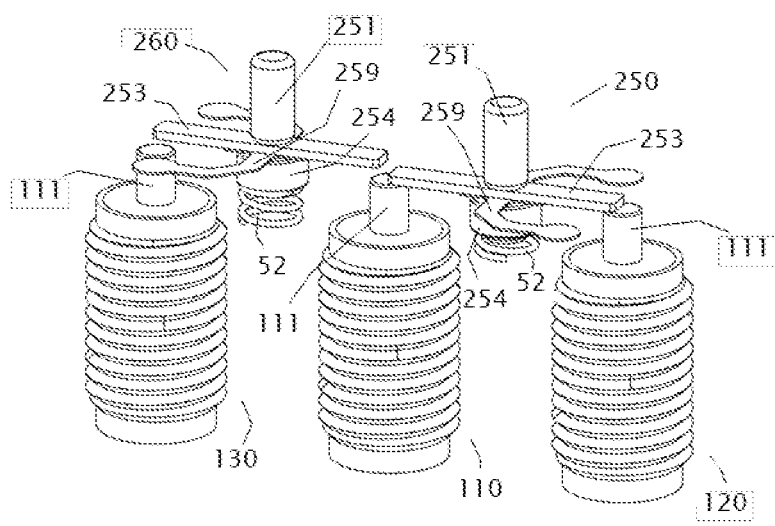
FIG. 5 is another exploded and detailed view of the exemplary embodiment of a coaxial RF switch with a new confinement flexure with reference to FIG. 3.

FIGS. 3, 4 and 5 show a cross-sectional view and detailed views of an exemplary embodiment of a coaxial RF switch with new confinement flexures. With reference to FIGS. 3-5, an improved coaxial RF switch 200 suitably comprises a pair of solenoids 10 and 20, rocker assembly 30, permanent magnet 40, soft magnetic plate 80, pusher assemblies 50 and 60, cavity 70, coaxial connectors 110, 120, and 130, and confinement flexures 259.

Rocker assembly 30 comprises soft magnetic rocker 31, rocker cantilever 32 and pivot 33.

Pusher assemblies 50 and 60 comprises top pusher 251 and bottom pusher 254, restoring spring 52 and conductor reed 253. Top and bottom pushers 251 and 254 can be made of any dielectric material. Spring 52 can be made of stainless steel. One function of spring 52 is to push bottom pusher 254 upward to its natural position when no external force is applied. Conductor reed 253 can be made of any conducting material such as BeCu and are preferably plated with Gold. Flexure 259 can be made of any elastic material (e.g., Polyimide) and has enough bending flexibility and durability. Flexure 259 is affixed at the two ends to either cover 72 or lower body 71. The ends of flexure 259 comprise alignment features (semi-disc shapes) which align and coincide with the matching alignment features (semi-disc shape openings) in the body 71 or cover 72 (alignment features not shown in the cover 72). Conductor reed 253 is affixed (e.g., glued by using epoxy) to flexure 259 toward the center so that conductor reed 253 can move vertically while its displacements in other directions are restricted. Conductor reed 253 does not need to have a hole for fixation to either top pusher 251 or bottom pusher 254.

Each of coaxial conductors 110, 120 and 130 comprises center conductor 111, dielectric ring 112 and shell 113.

As shown in a coaxial RF switch 200 in FIGS. 3-5, when rocker 31 is attracted by left-hand core 11 of solenoid 10 and turns clockwise, the right end of rocker cantilever 32 pushes pusher assembly 250 downward and causes conductor reed 253 to connect the center conductors 111 of both coaxial conductors 110 and 120, enabling RF signals to pass from coaxial conductor 110 to coaxial conductor 120 (or vice versa) (closed state). At the same time, left hand pusher assembly 260 is pushed upward by restoring spring 52 and lifts left hand conductor reed 253, disconnecting the RF signal path between coaxial conductors 110 and 130 (open state). During these processes, flexure 259 binds conductor reed 253 such that said conductor reed 253 can move vertically while its displacements in other directions are restricted, guaranteeing the repeatability and reliability of the switching functions.

Oppositely, when rocker 31 is attracted by right-hand core 11 of solenoid 20 and turns counter-clockwise, the corresponding pusher assembly moves in the directions opposite to aforementioned which causes the RF channel between 110 and 120 to be open and the RF channel between 110 and 130 to be closed.

It is understood that a variety of methods can be used to fabricate the coaxial RF switch confinement flexures. The detailed descriptions of various possible fabrication methods are omitted here for brevity.

It will be understood that many other embodiments and combinations of different choices of materials and arrangements could be formulated without departing from the scope of the invention. Similarly, various topographies and geometries of the electromechanical relay could be formulated by varying the layout of the various components.

The corresponding structures, materials, acts and equivalents of all elements in the claims below are intended to include any structure, material or acts for performing the functions in combination with other claimed elements as specifically claimed. Moreover, the steps recited in any method claims may be executed in any order. The scope of the invention should be determined by the appended claims and their legal equivalents, rather than by the examples given above.

What is claimed is:

1. A coaxial RF switch with a confinement flexure comprising: body and a cover in electrical contact; wherein said body comprising at least a recessed opening;
   a pair of coaxial conductors;
   a confinement flexure suitably placed in said recessed opening with at least one end affixed to said body;
   a conductor reed affixed to said confinement flexure wherein said confinement flexure restricts stray movements of said conductor reed other than to move vertically to connect and disconnect with said pair of coaxial conductors; wherein said conductor reed contacts said cover when disconnecting from said pair of coaxial conductors.

2. A coaxial RF switch with a confinement flexure according to claim 1
   further comprising a top pusher above said conductor reed.

3. A coaxial RF switch with a confinement flexure according to claim 1
   further comprising a bottom pusher below said conductor reed.

4. A coaxial RF switch with a confinement flexure according to claim 1
   wherein said conductor reed does not have any openings.

5. A coaxial RF switch with a confinement flexure according to claim 1
   wherein said confinement flexure is made of polyimide.

* * * * *